United States Patent
Yang

(10) Patent No.: US 8,320,130 B2
(45) Date of Patent: Nov. 27, 2012

(54) HEAT DISSIPATION DEVICE WITH BRACKET

(75) Inventor: Jian Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 218 days.

(21) Appl. No.: 12/824,231

(22) Filed: Jun. 28, 2010

(65) Prior Publication Data

US 2011/0157830 A1 Jun. 30, 2011

(30) Foreign Application Priority Data

Dec. 30, 2009 (CN) .......................... 2009 1 0312680

(51) Int. Cl.
*H05K 7/20* (2006.01)
*F28F 7/00* (2006.01)
*H01B 7/42* (2006.01)

(52) U.S. Cl. ........ 361/711; 361/709; 361/710; 361/707; 361/719; 165/185; 165/80.2; 165/80.3; 174/15.2

(58) Field of Classification Search .................. 361/701, 361/707, 709–711, 719; 165/185, 80.2, 80.3; 174/15.2

See application file for complete search history.

(56) References Cited

U.S. PATENT DOCUMENTS

| | | | | |
|---|---|---|---|---|
| 6,343,017 B1 * | 1/2002 | Yu et al. | | 361/704 |
| 6,507,491 B1 * | 1/2003 | Chen | | 361/697 |
| 6,611,999 B1 * | 9/2003 | Hsu | | 24/457 |
| 6,625,021 B1 * | 9/2003 | Lofland et al. | | 361/697 |
| 6,745,824 B2 * | 6/2004 | Lee et al. | | 165/104.14 |
| 6,779,595 B1 * | 8/2004 | Chiang | | 165/104.33 |
| 6,883,594 B2 * | 4/2005 | Sarraf et al. | | 165/104.33 |
| 6,885,557 B2 * | 4/2005 | Unrein | | 361/704 |
| 7,304,846 B2 * | 12/2007 | Wang et al. | | 361/700 |
| 2002/0137369 A1 * | 9/2002 | Edwards et al. | | 439/77 |
| 2004/0035558 A1 * | 2/2004 | Todd et al. | | 165/104.26 |
| 2004/0188080 A1 * | 9/2004 | Gailus et al. | | 165/185 |
| 2005/0066487 A1 * | 3/2005 | Zhang | | 24/457 |
| 2005/0135063 A1 * | 6/2005 | Heesen | | 361/704 |
| 2005/0259405 A1 * | 11/2005 | He | | 361/729 |
| 2006/0082972 A1 * | 4/2006 | Kim | | 361/709 |
| 2006/0137861 A1 * | 6/2006 | Wang et al. | | 165/104.33 |
| 2006/0144572 A1 * | 7/2006 | Yu et al. | | 165/104.33 |
| 2006/0181850 A1 * | 8/2006 | Frank et al. | | 361/700 |
| 2006/0289149 A1 * | 12/2006 | He | | 165/104.33 |
| 2006/0291169 A1 * | 12/2006 | Lee et al. | | 361/704 |
| 2007/0044944 A1 * | 3/2007 | Lin | | 165/104.33 |
| 2007/0051501 A1 * | 3/2007 | Wu et al. | | 165/104.33 |
| 2007/0097637 A1 * | 5/2007 | Chen et al. | | 361/696 |
| 2007/0181286 A1 * | 8/2007 | Wang | | 165/80.3 |
| 2007/0217153 A1 * | 9/2007 | Lai et al. | | 361/700 |
| 2007/0261822 A1 * | 11/2007 | Lin et al. | | 165/104.33 |
| 2008/0084669 A1 * | 4/2008 | Xia et al. | | 361/704 |

(Continued)

*Primary Examiner* — Bradley Thomas
(74) *Attorney, Agent, or Firm* — Altis Law Group, Inc.

(57) ABSTRACT

An exemplary heat dissipation device includes a base plate, a bracket engaged with the base plate, and a heat radiator mounted on the base plate and the bracket. The bracket includes two parallel arms. The bracket defines an opening between the arms. Each of the arms extends downwardly two clasps. Each clasp of each arm comprises a blocking part and a connecting part connecting the blocking part. The base plate is received into the opening of the bracket and sandwiched and secured by the blocking parts of the clasps and the arms of the bracket.

13 Claims, 5 Drawing Sheets

U.S. PATENT DOCUMENTS

| | | | |
|---|---|---|---|
| 2008/0128111 A1* | 6/2008 | Zhou et al. | 165/80.3 |
| 2008/0144286 A1* | 6/2008 | Li et al. | 361/701 |
| 2008/0180915 A1* | 7/2008 | Lin | 361/704 |
| 2008/0212289 A1* | 9/2008 | Lin | 361/719 |
| 2008/0257527 A1* | 10/2008 | Li et al. | 165/80.3 |
| 2009/0040730 A1* | 2/2009 | Li et al. | 361/710 |
| 2009/0056918 A1* | 3/2009 | Li et al. | 165/104.33 |
| 2009/0101318 A1* | 4/2009 | Ma | 165/104.33 |
| 2009/0135562 A1* | 5/2009 | Yang | 361/697 |
| 2009/0168350 A1* | 7/2009 | Xu | 361/697 |
| 2009/0244851 A1* | 10/2009 | Kuo et al. | 361/719 |
| 2009/0305524 A1* | 12/2009 | Lin et al. | 439/68 |
| 2010/0038057 A1* | 2/2010 | Li et al. | 165/80.3 |
| 2010/0073877 A1* | 3/2010 | Yu et al. | 361/697 |
| 2010/0172103 A1* | 7/2010 | Du | 361/710 |
| 2011/0141686 A1* | 6/2011 | Liu | 361/679.47 |

* cited by examiner

HEAT DISSIPATION DEVICE WITH BRACKET

BACKGROUND

1. Technical Field

The present disclosure relates to a heat dissipation device and, more particularly, to a heat dissipation device for cooling an electronic component, such as an integrated circuit package. The heat dissipation device includes a bracket facilitating assembly thereof.

2. Description of Related Art

Many electronic components, such as central processing units (CPUs), comprise numerous circuits operating at high speed and generating substantial heat. Under most circumstances, it is necessary to cool the CPUs in order to maintain safe operating conditions and assure that the CPUs function properly and reliably. In the past, various approaches have been used to cool electronic components. Typically, a heat dissipation device is attached to an outer surface of a CPU to remove the heat therefrom.

A typical heat dissipation device generally comprises a base for absorbing heat from an electronic component mounted on a printed circuit board, a fin assembly soldered on the base, and a bracket engaged with the base for mounting the base onto the printed circuit board. The base absorbs heat from the electronic component and transfers the heat to the fin assembly, whereupon the heat dissipates into the ambient air. The bracket is fixed to the base by screws. It is necessary to use a screwdriver or other tool to manipulate the screws. Therefore it is inconvenient for the heat dissipation device to be assembled.

Accordingly, what is needed is a heat dissipation device which can overcome the above-mentioned problems and shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
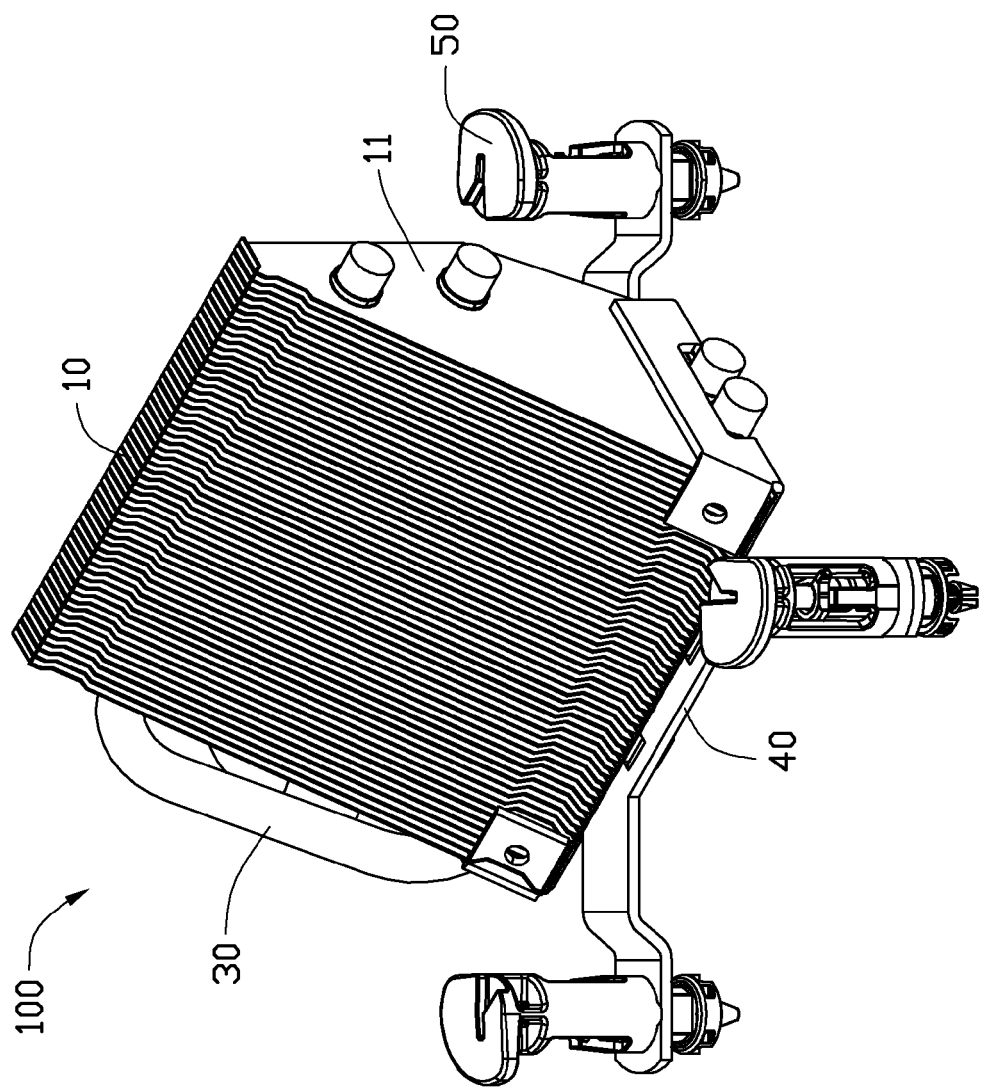
FIG. 1 is an assembled, isometric view of a heat dissipation device in accordance with an embodiment of the present disclosure.
Figure 2:
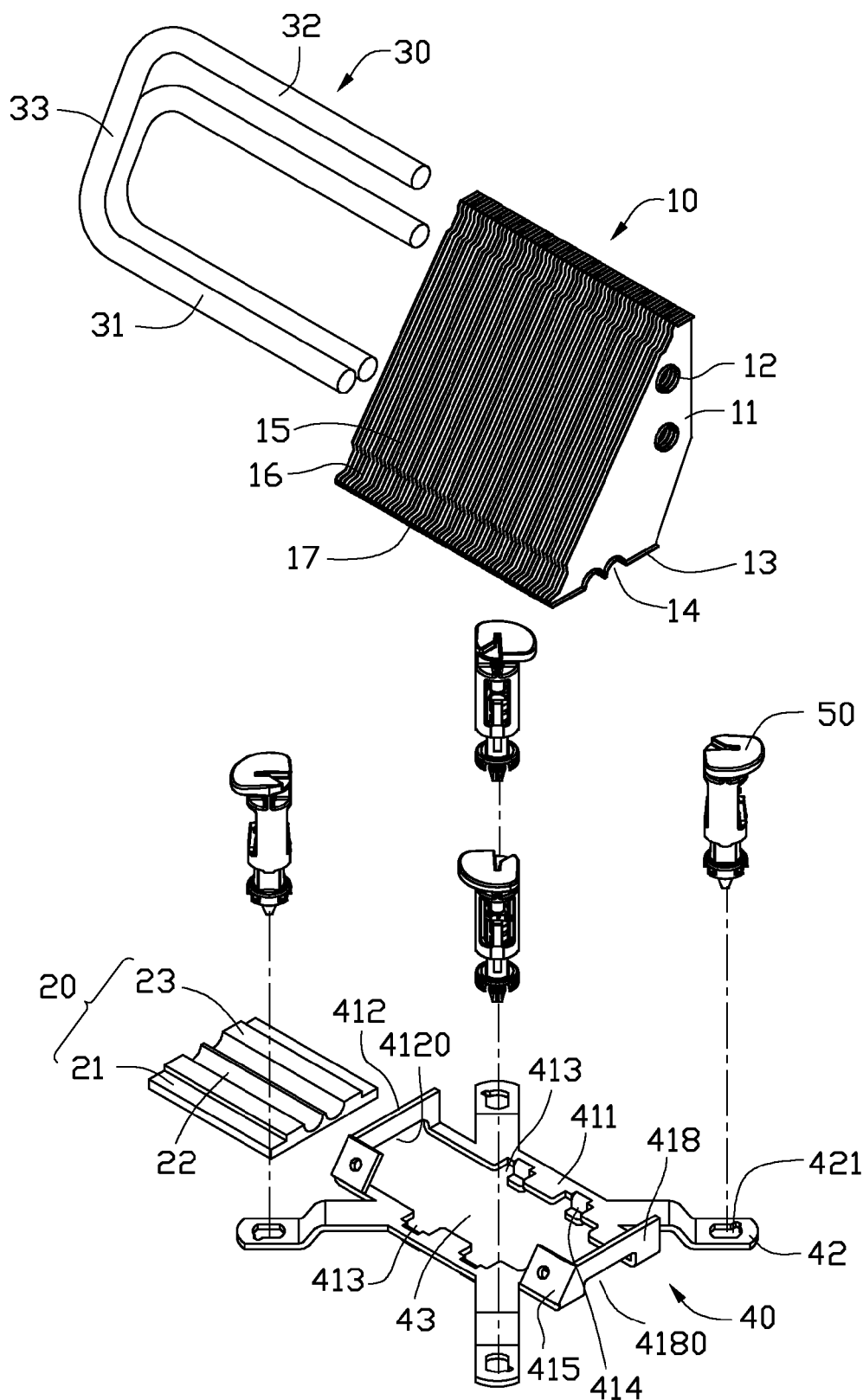
FIG. 2 is an exploded view of the heat dissipation device of FIG. 1.

Referring to FIGS. 1-2, a heat dissipation device 100 in accordance with a preferred embodiment of the present disclosure is shown. The heat dissipation device 100 is for mounting onto a printed circuit board (not shown) to remove heat from a heat-generating electronic component (not shown) attached on the printed circuit board. The electronic component can for example be a CPU (not shown). The heat dissipation device 100 comprises a heat radiator 10, a base plate 20, a pair of heat pipes 30 connecting the base plate 20 with the heat radiator 10, and a bracket 40 engaging the base plate 20 with the heat radiator 10. The heat dissipation device 100 further comprises a plurality of fasteners 50 to mount the bracket 40 on the printed circuit board.

The base plate 20 has a rectangular configuration. The base plate 20 has a bottom surface 21 (see FIG. 4) for contacting a top of the heat-generating electronic component. The base plate 20 comprises a top inserting portion 23 with a width less than that of a main portion 21 of the base plate 20. The base plate 20 defines two parallel grooves 22 at the inserting portion 23 thereof. Each of the grooves 22 defines a semicircular section.

The heat radiator 10 comprises a plurality of fins 11. The fins 11 are stacked together and mounted on the base plate 20. The fins 11 are separated from each other at uniform intervals. The heat radiator 10 has a wedge-shaped structure, which defines a bottom contact surface 13 and a lateral locating surface 15. The bottom contact surface 13 engages a top of the inserting portion 23 of the base plate 20. The heat radiator 10 defines two slots 14 at the bottom contact surface 13, corresponding to the grooves 22 of the base plate 20. The slots 14 cooperate with the grooves 22 to define channels 62 (see FIG. 5) for receiving the heat pipes 30 when the fins 11 of the heat radiator 10 are stacked together and mounted onto the base plate 20. The heat radiator 10 defines a pair of through holes 12 at a top portion thereof to receive the heat pipes 30. The lateral locating surface 15 of the heat radiator 10 is used to mount a fan (not shown) thereon. The lateral locating surface 15 is inclined with respect to the bottom contact surface 13. A first acute angle (not shown) is defined between the lateral locating surface 15 and the bottom contact surface 13. The heat radiator 10 defines a groove 16 at the lateral locating surface 15 near the bottom contact surface 13, thereby forming a flange 17 at an edge of the bottom contact surface 13.

The heat pipes 30 are U-shaped. Each heat pipe 30 comprises a horizontal evaporating portion 31, a condensing portion 32 parallel to the evaporating portion 31, and an adiabatic portion 33 connecting the evaporating portion 31 and the condensing portion 32.

Figure 3:
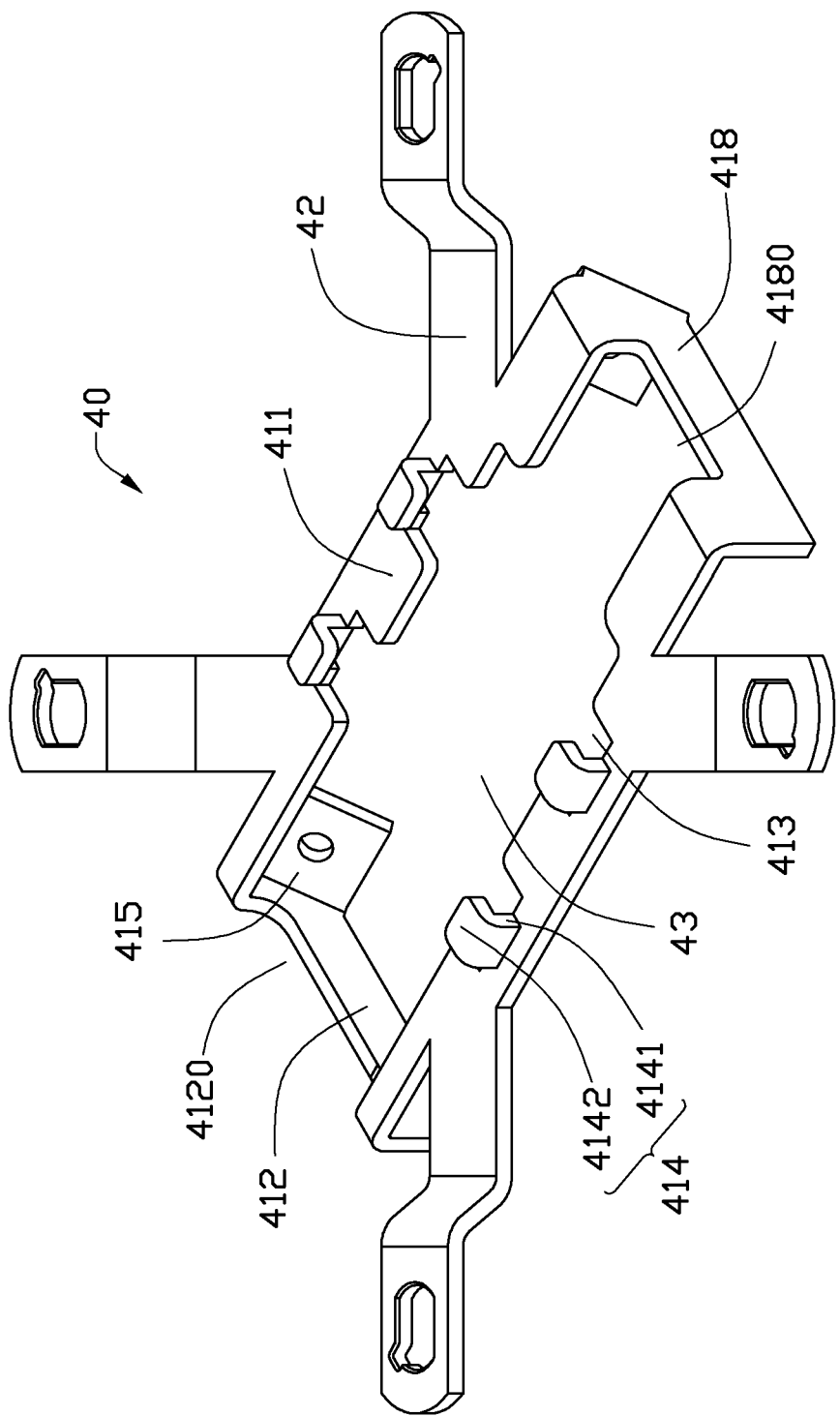
FIG. 3 is an enlarged, inverted isometric view of a bracket of the heat dissipation device of FIG. 2.

Referring also to FIG. 3, the bracket 40 is made of a single piece of metal. The bracket 40 includes a rectangular frame (not labeled), and four ears 42 extending in four different directions from four points of the frame. The bracket 40 defines an opening 43 in a central portion thereof. The opening 43 has a shape similar to that of the inserting portion 23 of the base plate 20. The bracket 40 includes two opposite arms 411, and a first wall 412 and a second wall 418 interconnecting ends of the arms 411, respectively. Thus, one of the arms 411, the first wall 412, the other arm 411 and the second wall 418 arranged end to end cooperatively surround the opening 43.

The arms 411 are positioned horizontally to have planar top surfaces (not labeled). An inner edge of each arm 411 is punched to define two cutouts 413 and form two clasps 414 extending downwardly from the inner edge. The cutouts 413 of the arms 411 are communicated with the opening 43 of the frame. Each of the clasps 414 is L-shaped, and comprises a connecting part 4141 extending downwardly from the arm 411 and a blocking part 4142 extending from a free end of the connecting part 4141. The connecting part 4141 is perpendicular to the corresponding arm 411, and the blocking part 4142 is perpendicular to the connecting part 4141 and parallel to the arm 411. Therefore, the blocking parts 4142 are below and spaced from the arms 411. The two blocking parts 4142 of one arm 411 face the two blocking parts 4142 of the other arm 411.

Each of the first and second walls 412, 418 is plate-shaped and upright, and interconnect corresponding ends of the arms 411. The first wall 412 defines a first undercut 4120 at a bottom thereof, and the second wall 418 defines a second undercut 4180 at a bottom thereof. The first undercut 4120 and the second undercut 4180 have rectangular shapes, and are communicated with the opening 43. The first undercut 4120 has a height larger than a thickness of the inserting portion 23 and a width the same as that of the inserting portion 23. In this embodiment, the first undercut 4120 is wider than the second undercut 4180 so that the base plate 20 can extend through the first undercut 4120 and abut against the bracket 40 at the second undercut 4180. Each of the first and second walls 412, 418 has an inclined baffle 415 extending from a lateral end thereof, respectively. The baffles 415 are located at the one same arm 411, and are aligned (coplanar) with each other. A second acute angle (not shown) is defined between each of the baffles 415 and the arm 411. Each of the second acute angles corresponds to the first acute angle defined between the lateral locating surface 15 and the bottom contact surface 13. In particular, each of the second acute angles is substantially equal to the first acute angle. A slit 416 (see FIG. 5) is defined between a bottom edge of each baffle 415 and the arm 411. The slits 416 are for receiving the flange 17 of the heat radiator 10.

Figure 4:
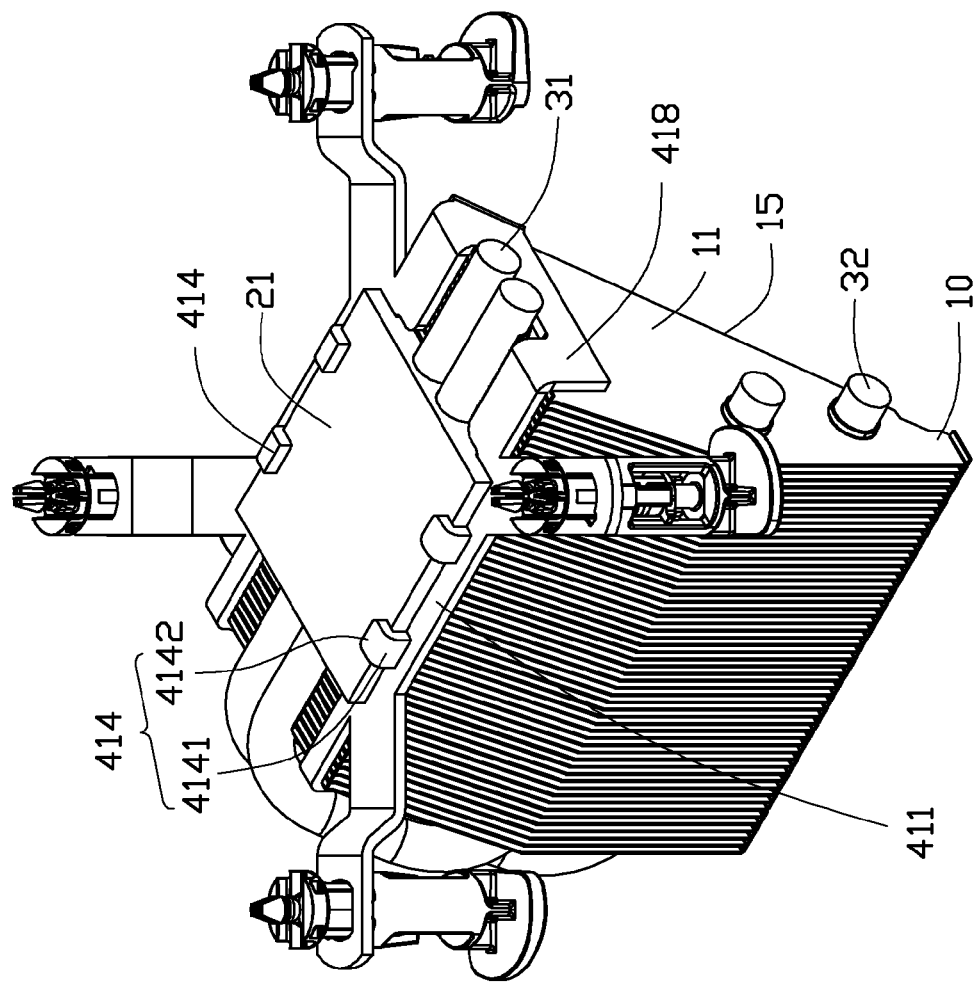
FIG. 4 is an inverted view of the heat dissipation device of FIG. 1.
Figure 5:
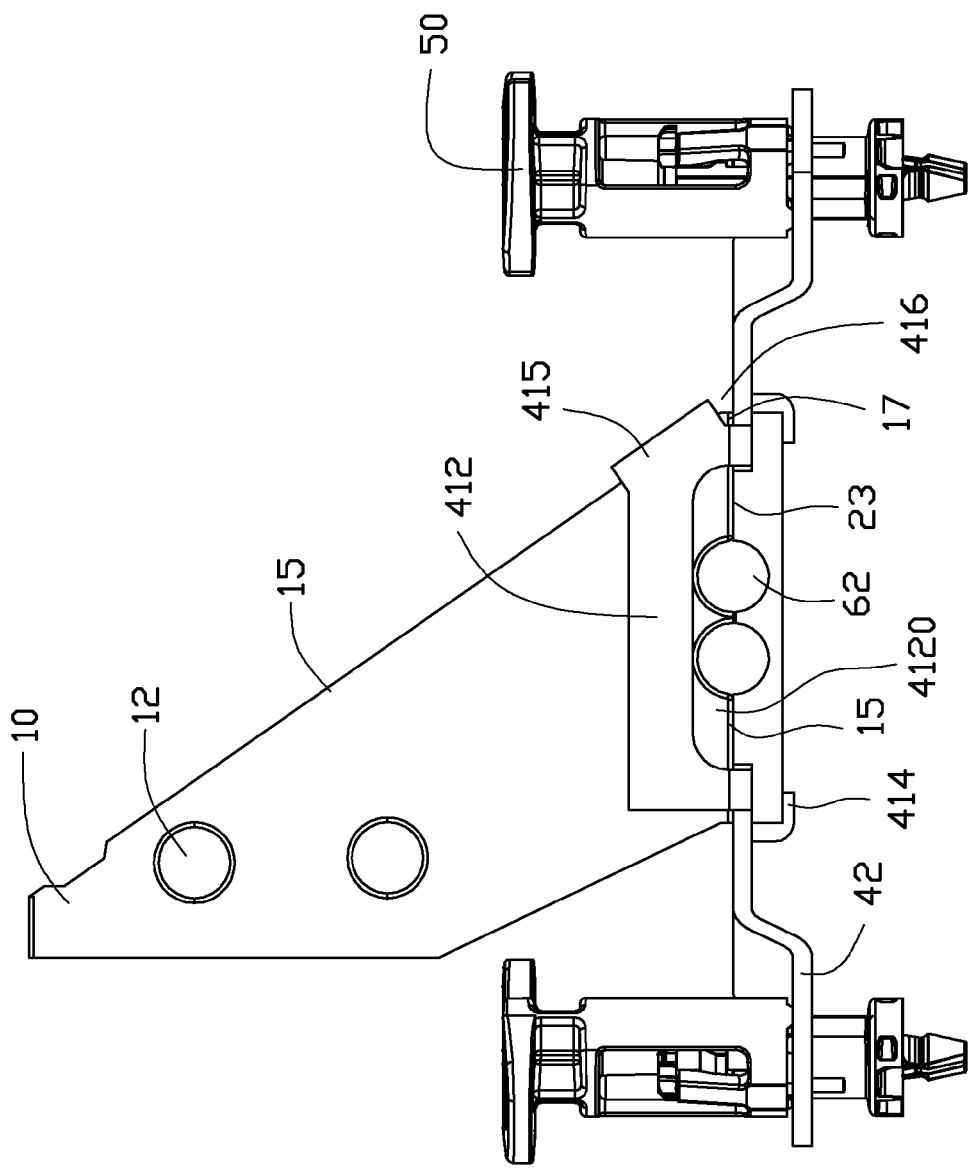
FIG. 5 is a left side plan view of the heat dissipation device of FIG. 1.

Referring also to FIGS. 4-5, in assembly of the heat dissipation device 100, the base plate 20 extends through the first undercut 4120 from an outer side of the bracket 40, until the base plate 20 abuts against the bracket 40 at the second undercut 4180. In other words, the base plate 20 slides into the bracket 40 along a transverse direction. The main portion 21 of the base plate 20 is sandwiched between the blocking parts 4142 of the clasps 414 and the arms 411 to firmly engage the bracket 40. The inserting portion 23 of the base plate 20 is received in the opening 43 of the bracket 40 and has a top surface parallel to a top surface of the arms 411 of the frame. The top surface of the base plate 20 and the bottom contact surface 13 of the heat radiator 10 are attached together with solder paste. The heat radiator 10 is placed on the inserting portion 23 of the base plate 20 and pushed along a lengthwise direction toward the baffle 415. The flange 17 of the heat radiator 10 inserts into the slits 416 between the baffles 415 and the corresponding arm 411. The heat radiator 10 is mounted on the arms 411 of the frame and sandwiched between the first and second walls 412, 415 of the bracket 40.

Then the evaporating portions 31 of the heat pipes 30 extend through the first undercut 4120 of the first wall 412, the channels 62 cooperatively defined by the slots 14 of the heat radiator 10 and the grooves 22 of the base plate 20, and the second undercut 4180 of the second wall 418. The condensing portions 32 of the heat pipes 30 extend through the through holes 12 of the heat radiator 10. Thereby, the heat radiator 10 is located in transverse directions by the first and second walls 412, 418, and located in lengthwise directions by the baffles 415 and the evaporating portions 31 of the heat pipe 30. Finally, the heat dissipation device 100 is heated at high temperature to solder the base plate 20, the heat radiator 10, and the heat pipes 30 together. The heat dissipation device 100 is thus assembled.

Advantages of the heat dissipation device 100 include the following. With the provision of the clasps 414 of the bracket 40 clamping the base plate 20, the heat dissipation device 100 is assembled conveniently and firmly, thereby reducing manufacturing costs of the heat dissipation device 100. In addition, the first and second walls 412, 418, the baffles 415, and the evaporating portions 31 of the heat pipe 30 together locate the heat radiator 10 in transverse directions and in lengthwise directions. Thus a strength of the heat dissipation device 100 is improved.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device for an electronic component, the heat dissipation device comprising:
   a base plate having a first face and a second face at opposite sides thereof, the first face for contacting the electronic component;
   a bracket engaging the base plate, the bracket comprising two parallel arms, the bracket defining an opening between the arms, each of the arms including at least a clasp extending downwardly therefrom, the at least a clasp of each arm comprising a blocking part and a connecting part connecting the blocking part; and
   a heat radiator mounted on the second face of the base plate and the bracket;
   wherein the base plate is received in the opening of the bracket and sandwiched and secured by the blocking parts of the clasps and the arms of the bracket;
   wherein the bracket is made of a single piece of metal, the at least a clasp of each arm being formed by punching;
   wherein the bracket further comprises a first wall and a second wall interconnecting ends of the arms, the first wall, the second wall, and the arms cooperatively surrounding the opening; and
   wherein each of the first wall and the second wall has an inclined baffle extending therefrom, the baffles being aligned with each other, and the heat radiator having a contact surface contacting the base and a lateral locating surface abutting against the baffles.

2. The heat dissipation device of claim 1, wherein each of the arms defines at least a cutout, and the at least a clasp of each arm is located at the at least a cutout.

3. The heat dissipation device of claim 1, wherein the base plate comprises an inserting portion protruding upward into the opening of the bracket, and a main portion sandwiched between the blocking parts of the clasps and the arms of the bracket, and the main portion is wider than the inserting portion.

4. The heat dissipation device of claim 1, wherein the first wall defines a first undercut and the second wall defines a second undercut, the base plate extending through the first undercut and abutting against the second wall at the second undercut.

5. The heat dissipation device of claim 4, further comprising at least a heat pipe connecting with the heat radiator and the base plate, the at least a heat pipe comprising an evaporating portion extending through the first undercut of the first wall and sandwiched by the base plate and the heat radiator, and a condensing portion extending through the heat radiator.

6. The heat dissipation device of claim 1, wherein the lateral locating surface and the bottom contact surface of the heat radiator define a first acute angle therebetween, each of the baffles and a same one of the arms of the bracket define a second acute angle therebetween, and each of the second acute angles corresponds to the first acute angle.

7. The heat dissipation device of claim 1, wherein a slit is defined between each of the baffles and a same one of the arms of the bracket, the heat radiator having a flange extending into the slits.

8. The heat dissipation device of claim 1, wherein the bracket comprises four ears outwardly extending in four different directions from four points of the arms.

9. A heat dissipation device for an electronic component, the heat dissipation device comprising:
- a base plate having first and second faces at opposite sides thereof, the first face for contacting the electronic component;
- a bracket engaged with the base plate, the bracket comprising two parallel, opposite arms, and a first wall and a second wall interconnecting ends of the arms, the first wall, the second wall, and the arms together defining an opening therebetween, the opening receiving the base plate, each of the first wall and the second wall having an inclined baffle extending therefrom, the baffles being coplanar with each other; and
- a heat radiator mounted on the second face of the base plate and the bracket, the heat radiator having a contact surface contacting the base plate and a lateral locating surface abutting against the baffles;
- wherein a slit is defined between each of the baffles and a same one of the arms of the bracket, the heat radiator having a flange extending into the slits.

10. The heat dissipation device of claim 9, wherein the lateral location surface and the bottom contact surface of the heat radiator define a first acute angle therebetween, each of the baffles and a same one of the arms of the bracket define a second acute angle therebetween, and each of the second acute angles corresponds to the first acute angle.

11. The heat dissipation device of claim 9, wherein each of the arms extending downwardly at least a clasp at an inner edge thereof to secure the base plate.

12. The heat dissipation device of claim 9, wherein the base plate is assembled to the bracket along a transversal direction parallel to the arms, and the heat radiator is assembled to the bracket along a lengthwise direction parallel to the first wall and second wall.

13. A heat dissipation device for an electronic component, the heat dissipation device comprising:
- a base plate having first and second faces at opposite sides thereof, the first face for contacting the electronic component;
- a bracket engaged with the base plate, the bracket comprising two opposite arms, and a first wall and a second wall interconnecting ends of the arms, the first wall, the second wall, and the arms together defining an opening therebetween, the opening receiving the base plate, each of the first and second walls having a baffle extending obliquely therefrom;
- a heat radiator mounted on the second face of the base plate and the bracket, the heat radiator having a contact surface contacting the base plate and a lateral locating surface abutting against the baffles; and
- a heat pipe connecting with the heat radiator and the base plate, the heat pipe comprising an evaporating portion extending through an undercut of the first wall and sandwiched by the base plate and the heat radiator, and a condensing portion extending through the heat radiator;
- wherein the heat radiator is located in transverse directions by the first and second walls, and located in lengthwise directions by the baffles and the evaporating portion of the heat pipe; and
- wherein a slit is defined between each of the baffles and a same one of the arms of the bracket, the heat radiator having a flange extending into the slit.

* * * * *